(12) United States Patent
Zierath et al.

(10) Patent No.: US 9,123,706 B2
(45) Date of Patent: Sep. 1, 2015

(54) ELECTROLESS FILLED CONDUCTIVE STRUCTURES

(75) Inventors: Daniel J. Zierath, Portland, OR (US); Shaestagir Chowdhury, Beaverton, OR (US); Chi-Hwa Tsang, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 20 days.

(21) Appl. No.: 13/976,084

(22) PCT Filed: Dec. 21, 2011

(86) PCT No.: PCT/US2011/066477
§ 371 (c)(1),
(2), (4) Date: Jun. 26, 2013

(87) PCT Pub. No.: WO2013/095433
PCT Pub. Date: Jun. 27, 2013

(65) Prior Publication Data
US 2013/0270703 A1    Oct. 17, 2013

(51) Int. Cl.
*H01L 23/485* (2006.01)
*H01L 21/768* (2006.01)
(Continued)

(52) U.S. Cl.
CPC ........ *H01L 23/485* (2013.01); *H01L 21/76831* (2013.01); *H01L 21/76844* (2013.01);
(Continued)

(58) Field of Classification Search
CPC .............. H01L 23/485; H01L 23/5384; H01L 21/76877; H01L 21/76871; H01L 21/76879; H01L 21/76873; H01L 21/76886; H01L 21/76892; H01L 23/522; H01L 23/532; H01L 23/5226; H01L 23/53238; H01L 23/53223; H01L 23/53252; H01L 23/53266
USPC ........... 257/751, 774; 438/653, 672, 675, 677
See application file for complete search history.

(56) References Cited

U.S. PATENT DOCUMENTS 5,529,956 A * 6/1996 Morishita .................... 438/639
6,281,121 B1 8/2001 Brown et al.
(Continued)

FOREIGN PATENT DOCUMENTS

KR  10-2002-0090439 A  12/2002
KR  10-2008-0062563 A  7/2008
(Continued)

OTHER PUBLICATIONS

English Machine Translation of JP 2010-080525, Mashima Shiro, published Aug. 4, 2010.*
(Continued)

*Primary Examiner* — Peniel M Gumedzoe
(74) *Attorney, Agent, or Firm* — Finch & Maloney PLLC (57) ABSTRACT

Techniques are disclosed that enable interconnects, vias, metal gates, and other conductive features that can be formed through electroless material deposition techniques. In some embodiments, the techniques employ electroless fill in conjunction with high growth rate selectivity between an electroless nucleation material (ENM) and electroless suppression material (ESM) to generate bottom-up or otherwise desired fill pattern of such features. Suitable ENM may be present in the underlying or otherwise existing structure, or may be provided. The ESM is provisioned so as to prevent or otherwise inhibit nucleation at the ESM covered areas of the feature, which in turn prevents or otherwise slows down the rate of electroless growth on those areas. As such, the electroless growth rate on the ENM sites is higher than the electroless growth rate on the ESM sites.

18 Claims, 10 Drawing Sheets

(51) Int. Cl.
*H01L 23/538* (2006.01)
*H01L 23/532* (2006.01)

(52) U.S. Cl.
CPC .... *H01L21/76846* (2013.01); *H01L 21/76849* (2013.01); *H01L 21/76864* (2013.01); *H01L 21/76874* (2013.01); *H01L 21/76877* (2013.01); *H01L 21/76879* (2013.01); *H01L 23/5384* (2013.01); *H01L 23/53238* (2013.01); *H01L 23/53252* (2013.01); *H01L 23/53266* (2013.01); *H01L 2924/0002* (2013.01)

(56) References Cited

U.S. PATENT DOCUMENTS

| | | | |
|---|---|---|---|
| 6,706,629 B1 * | 3/2004 | Lin et al. | 438/687 |
| 6,803,304 B2 * | 10/2004 | Asami | 438/613 |
| 7,279,084 B2 | 10/2007 | Chalupa et al. | |
| 7,371,311 B2 | 5/2008 | Zierath et al. | |
| 7,413,991 B2 * | 8/2008 | Tseng | 438/706 |
| 7,651,934 B2 | 1/2010 | Lubomirsky et al. | |
| 2005/0077180 A1 | 4/2005 | Zierath et al. | |
| 2006/0006071 A1 | 1/2006 | Che et al. | |
| 2006/0091018 A1 | 5/2006 | Cao et al. | |
| 2008/0113508 A1 | 5/2008 | Akolkar et al. | |
| 2010/0109161 A1 * | 5/2010 | Schuehrer et al. | 257/762 |
| 2010/0244252 A1 | 9/2010 | Jezewski et al. | |

FOREIGN PATENT DOCUMENTS

| | | |
|---|---|---|
| KR | 10-2011-0081155 A | 7/2011 |
| WO | 2013/095433 A1 | 6/2013 |

OTHER PUBLICATIONS

International Search Report and Written Opinion received for PCT Patent Application No. PCT/US2011/066477, mailed on Jul. 12, 2012, 16 pages.

\* cited by examiner

ELECTROLESS FILLED CONDUCTIVE STRUCTURES

BACKGROUND

In the manufacture of integrated circuits, interconnects are generally formed on a semiconductor substrate using a copper dual damascene process. Such a process typically begins with a trench being etched into a dielectric layer and then filled with a barrier/adhesion layer and a seed layer using a physical vapor deposition (PVD) sputtering process. An electroplating process is then used to fill the via and trench with copper metal to form the interconnect. However, as device dimensions scale down and the features become narrower, the aspect ratio of the features becomes more aggressive. The line-of-sight PVD process gives rise to issues such as trench overhang of the barrier/adhesion, and seed layers, leading to pinched-off trench and via openings during plating, and inadequate gap fill.

As will be appreciated, the figures are not necessarily drawn to scale or intended to limit the claimed invention to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed that enable interconnects, vias, metal gates, and other conductive features that can be formed through electroless material deposition techniques. In some embodiments, a layer of electroless nucleation material (ENM) and a layer of electroless suppression material (ESM) are used in conjunction to enable bottom-up fill of the feature. In some cases, the ENM is deposited first and then covered by ESM, which is then selectively etched to expose particular areas of ENM. Alternatively, the ESM can be deposited first and then be covered by ENM, which is then selectively etched and/or reflowed to expose particular areas of ESM. In still other cases, the ENM layer is an underlying or otherwise pre-existing metal layer that can be leveraged to provide desired nucleation sites. Electroless filler material (EFM) can then be deposited to fill the structure, in accordance with some embodiments. In general, the EFM nucleates on exposed ENM, but not on exposed ESM (or otherwise nucleates more slowly on the ESM than the ENM). Thus, a bottom-up electroless fill is enabled, thereby eliminating or otherwise reducing problems associated with line-of-sight trench deposition techniques.

General Overview

As previously explained, conventional interconnect processing involves barrier and copper seed layer deposition, followed by an electroplated gapfill process. The scaling of such conventional processes can be difficult because of, for instance, available real-estate and line-of-sight problems such as trench overhang of the barrier, adhesion, and seed layers, which in turn lead to pinched-off trench and via openings during plating, and inadequate gap fill.

Thus, and in accordance with one embodiment, a method for forming various conductive features, such as interconnects, trenches, dual damascene features (trench/vias), and through-vias, uses electroless fill in conjunction with high growth rate selectivity between an electroless nucleation material (ENM) and electroless suppression material (ESM) to generate bottom-up or otherwise desired fill pattern of such features. Suitable ENM may be present in the underlying or otherwise existing structure, or may be provided for the specific purpose of enabling a bottom-up or other desired fill process as described herein. An ESM is provisioned so as to prevent or otherwise inhibit nucleation at the ESM covered areas of the feature, which in turn prevents or otherwise slows down the rate of electroless growth on those areas. As such, the electroless growth rate on the ENM sites is higher than the electroless growth rate on the ESM sites. Thus, an electroless fill pattern can be customized by provisioning specific exposed areas of ENM within a conductive feature to be filled. To generate a bottom-up fill in accordance with some embodiments of the present invention, the nucleation rate of electroless metal growth on ENM relative to ESM is greater than one.

Selectivity of ESM deposition can be achieved in a number of ways. For instance, the ESM can be blanket deposited and then etched using any number of etch techniques, including for instance, wet and/or dry etching, isotropic and/or anisotropic etching, plasma etching, laser ablation, or other suitable etch processes. Alternatively, the ESM can be selectively deposited using directional deposition, such that ESM is only provided in areas where electroless growth is undesirable. Alternatively, a mask that is naturally selective to the ESM can be deployed using standard lithography, such that the ESM will only deposit on areas not having the mask material (or the inverse situation where the ESM will only deposit on areas having the mask material). Numerous techniques for providing the ESM in the desired areas where nucleation is to be prevented or otherwise inhibited will be apparent in light of this disclosure.

The areas where nucleation is desired, and hence where exposed ENM is desired, will depend on the given application and structure. In any such cases, electroless techniques can be used to deposit electroless filler material (EFM), which will nucleate on the ENM, but not on the ESM (or at a slower rate relative to the ENM), thereby generating the desired fill pattern. In some such example embodiments, the desired fill pattern is a bottom-up fill wherein the EFM nucleates on the bottom surface of the trench or structure being filled, but not on the sidewalls, thereby eliminating or otherwise significantly reducing the occurrence of trench overhang and pinch-off conditions. In such a case, the area of the feature with exposed ENM is the bottom surface of the feature (e.g., trench or via). In a more general sense, ENM can be selectively provisioned within a feature to be filled in any manner to enable a corresponding desired fill pattern.

Consistent with another embodiment, an ESM is layered on a feature (e.g., trench or via structure) to prevent electroless growth. Suitable ENM is then selectively deposited onto the feature only in areas where electroless growth is desirable (e.g., using directional deposition techniques). Alternatively, a non selectively deposited layer ENM can be reflowed to cause the ENM to flow to a bottom surface of the feature to be filled, to expose underlying ESM on the sidewalls of the feature. As will be appreciated, this reflow can be carried out at a temperature high enough to reflow the ENM but not high enough to reflow the ESM. In another alternative, a layer of ENM can be non-selectively deposited and then etched using any number of suitable etch techniques, including for instance, wet and/or dry etching, isotropic and/or anisotropic etching, plasma etching, laser ablation, or other suitable etch processes to expose the underlying ESM in areas where electroless growth is undesirable (e.g., sidewalls of high-aspect ratio vias and/or trenches). Electroless techniques can then be used to deposit an EFM or multiple EFMs, which will nucleate on the ENM at a higher rate than on the ESM, generating the desired fill pattern. In some such embodiments, the desired fill pattern is a bottom-up fill wherein the EFM nucleates on the bottom surface of the trench or structure being filled faster.

Consistent with a further embodiment, multiple EFMs or multiple depositions of the same EFM can be used to fill the same feature. In some such embodiments, the second or otherwise later deposited EFM may nucleate on the previous EFM. In other such embodiments, an additional layer of ENM can be deposited on the previous EFM such that the subsequent EFM may nucleate on the additional layer of ENM. Note that additional layers of ESM can be used to facilitate processing in accordance with some such embodiments of the present invention.

Consistent with still another embodiment, the feature may only be partially filled by the EFM car EFMs and all subsequent fill can be completed, for example, by depositing a cap material directly onto the exposed EFM. The cap material can be deposited, for instance, by atomic layer deposition (ALD), chemical vapor deposition (CVD), physical vapor deposition (PVD), electroplating, or electroless processes. In some such cases, a diffusion barrier layer can be interposed between the EFM and the cap material. Such a barrier layer may be desirable, for instance, to prevent the formation of a galvanic couple at the interface of differing EFM depositions.

While specific embodiments of conductive feature fabrication processes and structures provided herein include, for instance, ENM layers, ESM layers, and electroless metal fill materials, numerous material and fill-pattern schemes will be apparent in light of this disclosure and the claimed invention is not intended to be limited to conductive structures having a particular ENM-ESM-EFM scheme. In addition, various example processing techniques are provided herein (e.g., ALD, CVD, PVD, electroplating, electroless deposition, etc), but other suitable processing techniques may also be used to provide structures fabricated as described herein.

Conductive Structures

FIGS. 2A-2F', 3A-3G', and 4A-4E" illustrate formation of example conductive structures configured in accordance with various embodiments of the present invention. Each of these examples generally include trench or dual damascene recesses that can be used, for example, as conductive pathways, contacts, transistor gates, vias, interconnects, or other such metal features. As can be seen in these cross-section side-views, the trenches and dual damascene structures are fabricated in a dielectric layer deposited on or otherwise formed in a substrate. Other conductive structures having any number of profiles, geometries, and functions can benefit from an embodiment of the present invention, as will be appreciated in light of this disclosure.

Any number of suitable substrates can be used to implement the substrate, including bulk substrates (e.g., silicon, germanium, III-V materials, etc), semiconductor-on-insulator substrates (XOI, where X is a semiconductor material such as silicon, germanium or germanium-enriched silicon), and multi-layered structures. In one specific example case, the substrate is a silicon bulk substrate. In other implementations, the substrate may be formed using alternate materials, which may or may not be combined with silicon, that include but are not limited to germanium, silicon germanium, indium antimonide, lead telluride, indium arsenide, indium phosphide, gallium arsenide, or gallium antimonide. Further materials classified as group III-V or group IV materials may also be used to form the substrate. Although a few examples of materials from which the substrate may be formed are described here, any material that may serve as a foundation upon which an integrated circuit having interconnects and/or conductive features may be built falls within the spirit and scope of the claimed invention.

The dielectric layer may be implemented with any suitable dielectric or insulator materials, including those commonly used in integrated circuit applications, such as oxides (e.g., silicon dioxide, carbon doped oxide), silicon nitride, or organic polymers (e.g., perfluorocyclobutane or polytetrafluoroethylene), fluorosilicate glass, and organosilicates (e.g., silsesquioxane, siloxane, or organosilicate glass). The dielectric material may be low-k or high-k depending on the desired isolation, and may include pores or other voids to further reduce its dielectric constant. Although only one trench/via structure is generally shown, the dielectric layer may include multiple such structures (such as shown in the example configuration of FIG. 2A'), and some embodiments may include multiple dielectric layers. The dielectric layer thickness can vary greatly, but in some example embodiments is in the range of 50 nm to 5000 nm. Numerous dielectric layer configurations can be used and the claimed invention is not intended to be limited to any particular set of material systems or geometries.

The via and/or trench can be formed in the dielectric layer, for example, using standard lithography including via and/or trench patterning and subsequent etch processes followed by planarization, polishing, cleans, or other desired processing. The patterning and etch processes can be called out, for instance, using wet and/or dry etch techniques. The trench and via dimensions can vary, depending on the application. In some example cases, the trench opening is about 10 nm to 100 nm (e.g., 20 to 50 nm) and the via opening is about 5 nm to 50 nm (e.g., 10 to 25 nm), and the entire structure has an aspect ratio in the range of about 10:1 to 1:1 (e.g., 5:1). As will be appreciated, the via and/or trench geometry will vary from one embodiment to the next, and the claimed invention is not intended to be limited to any particular configuration.

As will be further appreciated in light of this disclosure, the structure to be filled may or may not interact with other features or structures formed in other layers of the dielectric. For instance, in the cross-section of the example integrated circuit shown in FIGS. 1A-1G, the trench does not conductively couple with other features above or below the trench, in that particular cross-section as illustrated. In such cases, the trench may simply be, for instance, a narrow conductive trace that runs from one point to another point on a given layer (which may be the only layer of the structure or one layer in a stack of layers), so as to electrically connect two components or other features (e.g., I/O pin, transistor electrode, capacitor electrode, etc) disposed on that layer. In contrast, in the cross-sections of the example integrated circuits shown in FIGS. 1G', 2A-2F', 3A-3G', and 4A-4E'', the conductive feature being filled is a damascene structure that conductively couples with other features above and/or below that structure. Such a stacked via and/or trench configuration can be used, for instance, in a memory array or other multi-layer integrated circuit. One such example structure is further illustrated in FIG. 2A', which generally shows a dynamic random access memory (DRAM) integrated circuit that includes a plurality of stacked interconnect layers (two shown) on top of the substrate. This DRAM circuit will be discussed in turn.

Figure 1A:
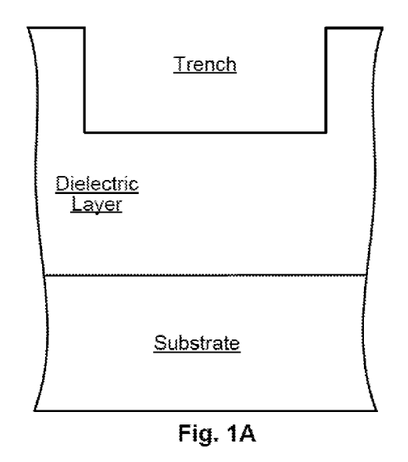
FIGS. 1A-G' illustrate formation of example conductive trench structures in accordance with various embodiments of the present invention.

FIGS. 1A-G' illustrate formation of example conductive trench structures in accordance with various embodiments of the present invention. In general, the demonstrated process enables a bottom-up fill of electroless metal for trenches using diffusion barrier removal from feature bottom. FIG. 1A shows formation of the trench in the dielectric layer. This can trench formation be carded out as previously explained. The trench may serve any number of functions, such as a conductive run, a gate of a field effect transistor (FET), or a contact.

Figure 1B:
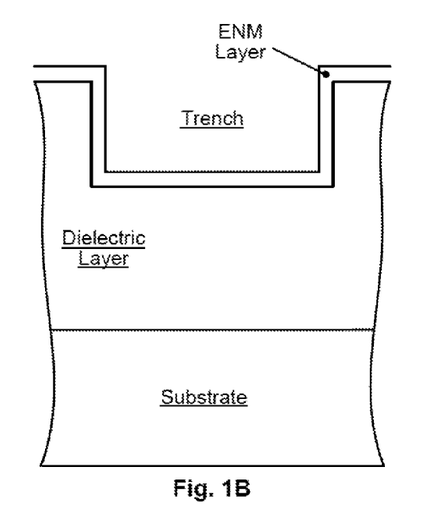

FIG. 1B illustrates deposition of an ENM layer on the trench recess, in accordance with an embodiment of the present invention. The ENM may be a pure metal in some example embodiments, while in other example embodiments may be a doped alloy to make it amorphous in nature and thereby improve its diffusion barrier properties and adhesion to the dielectric layer. In some specific cases, the ENM layer is implemented with gold, nickel, copper, cobalt, ruthenium, tungsten, aluminum, palladium, tin, silver, cobalt boride, cobalt phosphide, nickel boride, nickel phosphide, palladium boride, palladium phosphide, ruthenium boride, ruthenium phosphide, tungsten boride, tungsten phosphide, combinations thereof, or any other suitable nucleation material is deposited using PVD, CVD, ALD, or other suitable deposition technique (e.g., electroless, electroplating), to provide a selectively located and/or continuous and conformal ENM layer. The thickness of the ENM layer can vary, and in some such embodiments is in the range of one-to-several monolayers to several hundred nanometers. In a more general sense, any ENM layer thickness sufficient for nucleation of the desired fill metal and to promote electroless growth at a desired rate can be used, and the claimed invention is not intended to be limited by any particular range of ENM layer thicknesses or other dimensions.

Figure 1C:
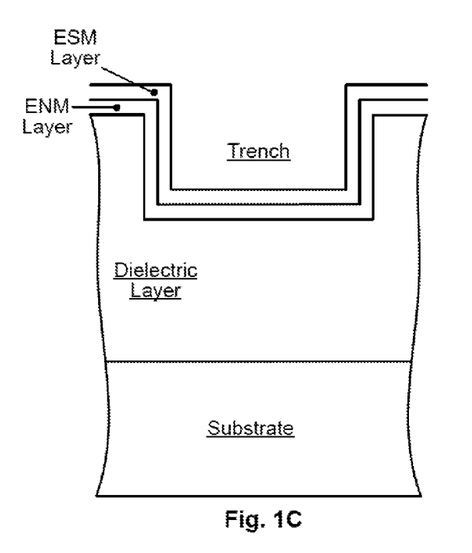

As shown in FIG. 1C, a layer of ESM is deposited or otherwise formed on the ENM layer. In some embodiments the ESM can be a metal or dielectric or diffusion barrier material, such as tantalum, titanium, tantalum nitride, titanium nitride, tungsten nitride, molybdenum nitride, silicon nitride, silicon dioxide, aluminum oxide, or other suitable material that will suppress or otherwise inhibit electroless metal growth on feature sidewalls or other feature areas. Just as with the ENM layer thickness, the thickness of the ESM layer can vary, and any ESM layer thickness sufficient to suppress or otherwise sufficiently inhibit ENM growth to enable a desired fill pattern can be used. An example range of ESM layer thickness is one-to-several monolayers to several hundred nanometers. The ESM can be deposited or formed in a number of ways. In some example embodiments, for example, a nitrogen ($N_2$), oxygen ($O_2$) or carbon based gas in a plasma, CVD, ALD, or thermal process is used to modify the surface of the ENM layer to effectively provide an ESM layer. In some such example cases, the modification of the ENM surface should be tunable so the bulk of the ENM is intact and conductive, while the modified ENM surface can suppress or otherwise sufficiently electroless growth. In other embodiments, an ultra-thin (e.g., one-to-several monolayers thick) layer of dielectric material such as an oxide or nitride (e.g., silicon nitride, silicon dioxide, aluminum oxide, etc) is deposited or otherwise formed on the ENM layer to provide the ESM layer. In still other embodiments, an ultra-thin (e.g., one-to-several monolayers thick) layer of conductive diffusion barrier material (e.g., tantalum, titanium, tantalum nitride, titanium nitride, tungsten nitride, molybdenum nitride, etc) is deposited by, for example, PVD, CVD or ALD on the ENM layer to provide the ESM layer. Just as with the ENM, the ESM can be chosen or otherwise configured to provide acceptable diffusion barrier properties.

Figure 1D:
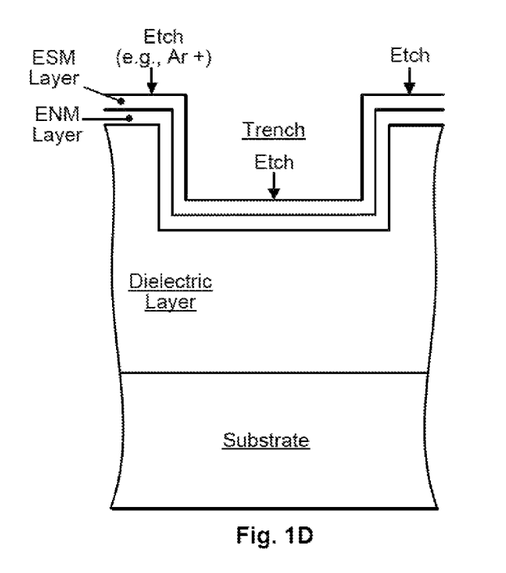
Figure 1E:
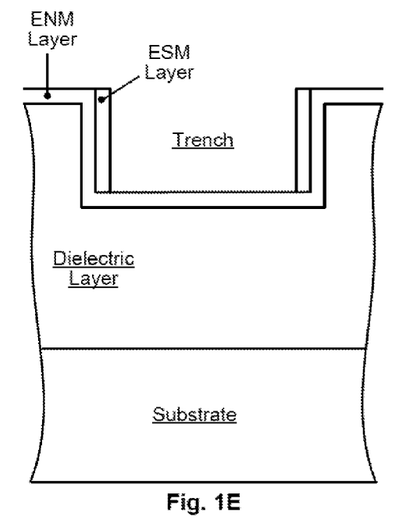

After the ESM layer is provided, it can then be etched, as best shown in FIG. 1D. Recall, however, that in some embodiments, the ESM can be selectively deposited (e.g., directional deposition), such that no or only minimal etching would be necessary. When appropriate, the ESM can be etched using any number of etch techniques as previously explained, including for instance, wet and/or dry etching, isotropic and/or anisotropic etching, plasma etching, laser ablation, or other suitable etch processes. In one specific example embodiment, a tuned argon ion (Ar+) etch is used to remove the ESM from the field and bottom of the trench, leaving ESM only on the trench sidewalls. In a more general sense, the ESM is left in areas where electroless growth is undesirable. An example resulting structure after the etch for selective deposition of the ESM layer) is shown in FIG. 1E, which shows the remaining ESM only on the trench sidewalls. In other embodiments, ESM may be left in other locations as well, such as on the surfaces to the left and/or right of the trench, if so desired.

Figure 1F:
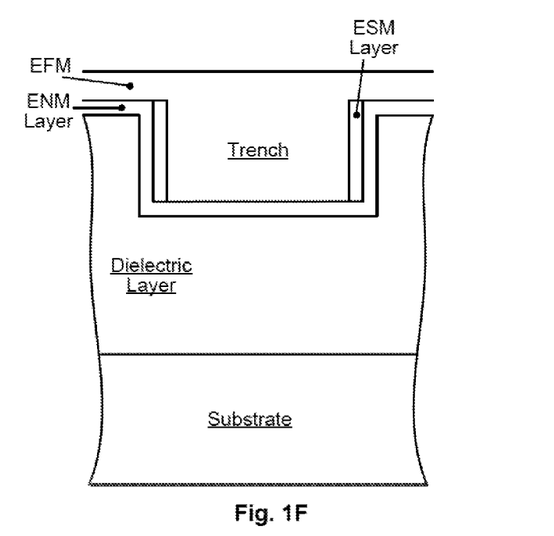

As shown in the example embodiment of FIG. 1F, EFM can be deposited to at least partially fill the trench using, for example, electroless techniques. In some example embodiments, conventional selective electroless techniques are used to deposit at least one metal such as, for example, copper, nickel, silver, gold, platinum, cobalt, tungsten, or alloys thereof such as copper-cobalt, copper-tin, cobalt phosphorous tungsten, nickel-phosphorous-tungsten, or any other suitable EFM that will nucleate on the ENM but not on the ESM (or otherwise at a slower rate than on the ENM). In the example shown in FIG. 1F, this will yield a bottom-up fill of the trench. The growth rate selectivity (GRS) of this EFM deposition can generally be defined as the electroless growth rate on the ENM divided by the electroless growth rate on ESM. In general, the higher the GRS, the greater the rate of bottom-up fill for the EFM. As will be appreciated, while the EFM will not nucleate and grow on the ESM layer as fast as it does on the ENM layer, there may be some marginal or otherwise negligible nucleation and growth of EFM on the ESM layer, but a bottom-up fill is still enabled. The electroless chemistry and ENM/ESM can be selected to maximize selectivity.

As will be apparent in light of this disclosure, other processes and/or alternate process sequencing may be executed in accordance with various embodiments of the present invention. One example such process is chemical-mechanical planarization (CMP) which, in some embodiments, can be used to remove excess ENM, ESM, EFM, and/or other excess materials, as shown in the example resulting structure of FIG. 1G. Examples of other such additional processing include, for instance, various clean processes (e.g., to prepare exposed ENM layer for subsequent electroless deposition of EFM), and deposition of passivation layers and any necessary planarization and/or polishing, so that another layer can be formed thereon.

Figure 1G:
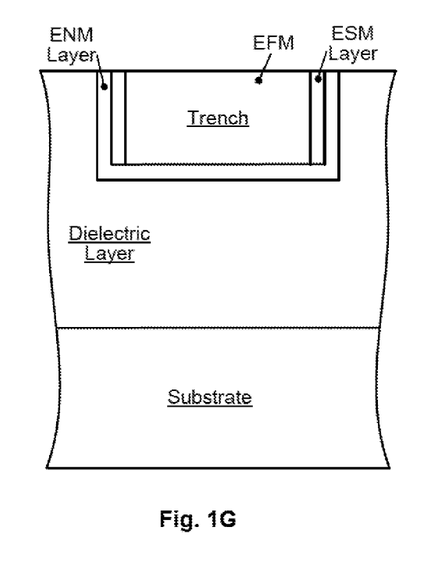

FIG. 1G' shows an alternative embodiment of a trench structure that is filled without depositing an ENM layer into the trench. Rather, in this example case, the previously described trench etch process not only forms the trench structure in the dielectric layer, but also exposes an underlying metal at the bottom of the trench. The underlying metal may be, for example, formed earlier in the fabrication process for the specific purpose of providing a landing pad and nucleation site for the subsequent trench etch and EFM deposition process, or alternatively an existing metal structure that serves some other purpose but can also be leveraged as a nucleation site. In one specific example case, the underlying metal layer is a conductive cap (e.g., copper) from the previous metal layer, suitable for electroless metal growth. In some cases, the ESM layer deposition is selective (e.g., directional deposition), such that the deposition is only on the trench sidewalls, but not on the underlying metal or field surfaces. In other embodiments, the deposition is non-selective and then etched accordingly, to expose the underlying metal. Note that the ESM layer could be, for example, a diffusion barrier (e.g., tantalum) that is selectively removed from bottom of trench to facilitate an electroless bottom-up metal fill as described herein. After the EFM is provided, the resulting integrated circuit structure can then be planarized and/or otherwise further processed as desired.

Figure 2A:
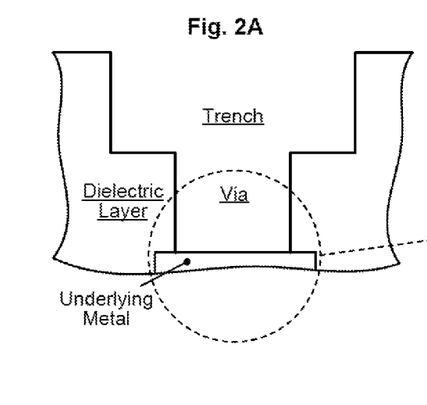
FIGS. 2A-F' illustrate formation of example conductive dual damascene interconnect structures in accordance with embodiments of the present invention.

FIGS. 2A-F' illustrate formation of example conductive dual damascene interconnect structures in accordance with embodiments of the present invention. In general, the demonstrated process enables a bottom-up fill of electroless metal for dual damascene features using diffusion barrier removal from the feature bottom. FIG. 2A shows the etched dual damascene recess in the dielectric layer. This etch process can be carried out as previously explained. The dual damascene feature in this example includes a trench portion and a via portion. Note that previous discussion with respect to various details and aspects of the techniques provided herein is not always repeated but is equally applicable to related aspects of other embodiments provided herein, as will be appreciated in light of this disclosure.

As can be farther seen, the etch lands on an underlying metal, which as previously explained can be, for example, a conductive cap of a lower metal layer or feature, or other previously provided metal suitable for electroless metal growth. FIG. 2A' shows a specific example embodiment where the underlying metal landing pad is a metal line of a lower layer in a DRAM integrated circuit structure. As can be further seen, the substrate is configured with various DRAM cell components integrated therein, such as access transistor T and word line WL. Such DRAM devices typically include a plurality of bit cells, with each cell generally including a storage capacitor communicatively coupled to a bitline by way of an access transistor that is gated by a word line. Other typical DRAM components and features not shown can also be included (e.g., row and column select circuitry, sense circuitry, power select circuitry, etc). Each layer includes various metal lines (M1, M1', M2, and M2') and corresponding vias (V0, V0', V1, and V1') formed within an interlayer dielectric (ILD) material. Note that the layout shown is not intended to implicate any particular feature spacing or density. Rather, this layout is simply an arbitrary example, and any number of layout designs can benefit from an embodiment of the present invention, where trenches, vias, and other interconnect or conductive features are formed as described herein. Each layer in this example structure is generally isolated or otherwise demarcated from neighboring layers by an etch stop layer. In addition, each metal line and via of this example embodiment is configured with a barrier layer, at least some of which are formed with ENM and/or ESM layers implemented as described herein to enable electroless bottom-up fill. Other embodiments may include fewer or more such layers. In this particular example case, FIGS. 2A and 2A' show how via V1 electrically connects metal line M2 to the underlying metal line M1. Thus, the metal line M2 shown in FIG. 2A' is the underlying metal shown in FIG. 2A.

Figure 2B:
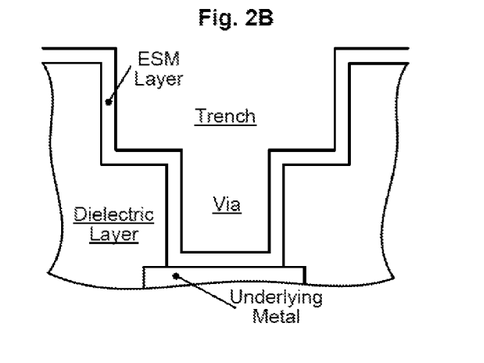
Figure 2C:
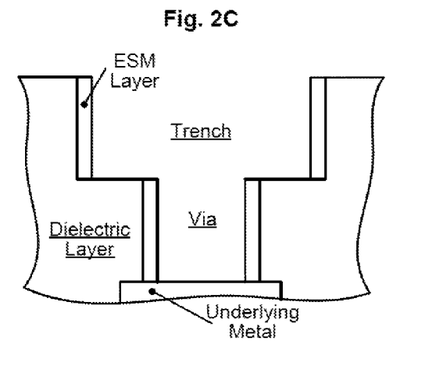

As shown in FIG. 2B, a layer of ESM is deposited or otherwise formed on the dual damascene trench. The previous discussion with reference to the ESM layer in FIG. 1C is equally applicable here, except that the ESM layer in this example configuration is deposited directly onto the dielectric layer. As will be appreciated in light of this disclosure, a continuous doped ENM layer may allow for better diffusion barrier properties and better adhesion to the dielectric layer. However, the ESM layer can also be deposited or otherwise formed directly on the dielectric layer, and then etched (if necessary) to expose the underlying metal, as best shown in FIG. 2C. The previous discussion with respect to etching of the ESM layer (e.g., Ar ion etch or some other plasma/chemical etch technique) is equally applicable here. Note that not only is the underlying metal exposed at the feature via bottom, but also the flats of the trench portion, thereby exposing the dielectric layer in those areas.

Figure 2D:
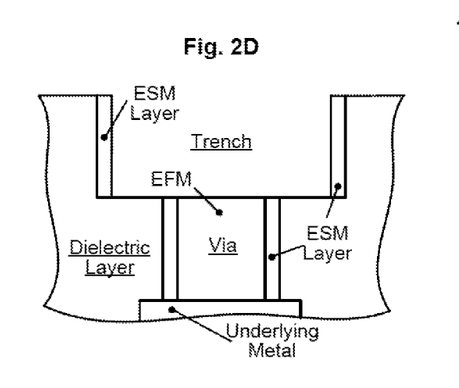
Figure 2E:
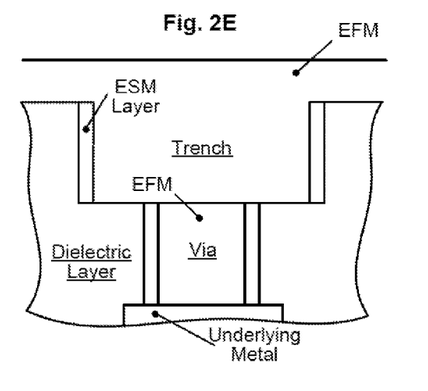

As shown in the example embodiment of FIG. 2D, EFM can then be deposited to at least partially fill the via portion. In addition, the same or a different EFM can then be deposited to fill the trench portion using the same or different deposition technique (e.g., electroless, etc), as best shown in FIG. 2E. The previous discussion with reference to provisioning the EFM as well as the GRS is equally applicable here. However, in such cases where there is exposed trench surface (dielectric layer), dopants can be used in the EFM to assist in forming a strong metal-dielectric interface. For example, assuming the dielectric layer is an oxide such as silicon dioxide, the EFM (e.g., copper alloy) deposited in the trench portion can be doped with, for example, antimony, silver, or other dopant that will react with the exposed oxide dielectric in the flat to form a strong metal-oxide interface. Other dopant and adhesion promotion techniques can be used as well, as will be appreciated in light of this disclosure. After the EFM is provisioned, the resulting structure can be planarized/polished, as previously described with reference to FIG. 1G (e.g., using CMP), and as best shown in FIG. 2F.

Figure 2F:
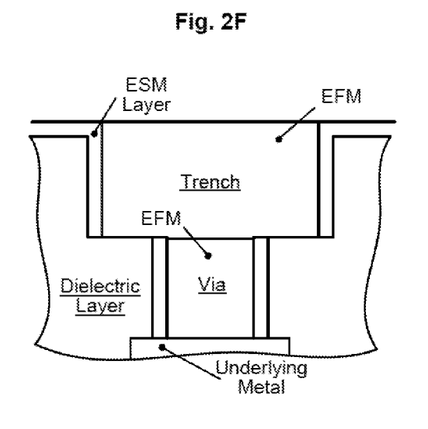

In some example embodiments where a subsequent EFM is deposited on a first layer of EFM, the subsequent EFM deposition can be made using the same EFM used in the first deposition or an additional suitable EFM material can be used, as previously indicated in such embodiments the subsequent EFM or EFMs may nucleate directly on the previous layer of EFM as shown in FIGS. 2E and 2F, or a layer of EFM can be interposed between two EFM layers as shown in FIGS. 2E' and 2F'. As further shown in FIGS. 2F' and 2F', an additional layer of ESM can also be used to facilitate processing. In cases where these additional ENM and ESM layers are used such as, for example, ESM Layer 1 and ESM Layer 2, depicted in FIGS. 2E' and 2F', the materials chosen for each layer may be independently selected for each layer. Accordingly, materials used for ENM and ESM layers may, for example, be the same throughout the structure or each may be comprised of a different material. The structure shown in FIG. 2F' is the planarized version of the structure shown in FIG. 2E'.

FIGS. 3A-G' illustrate formation of example conductive dual damascene interconnect structures in accordance with other embodiments of the present invention. As will be appreciated, these example structures are similar to those of FIGS. 2A-2F', except that an ENM layer is provided on the trench/via recess and flats. Other various distinctions will now be discussed in turn.

Metal Cap

Figure 3A:
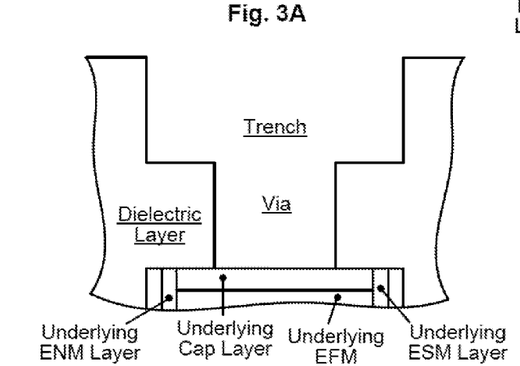
FIGS. 3A-G' illustrate formation of example conductive dual damascene interconnect structures in accordance with other embodiments of the present invention.

FIG. 3A shows formation of the etched dual damascene recess in the dielectric layer, which can be carried out as previously explained. As can be further seen, the etch lands on an underlying metal cap layer in this example embodiment, which is in turn disposed on an underlying EFM layer. In addition, underlying ENM and ESM layers are shown. Such air integrated circuit structure may be, for example, similar to the memory circuit shown in FIG. 2A'.

Figure 3B:
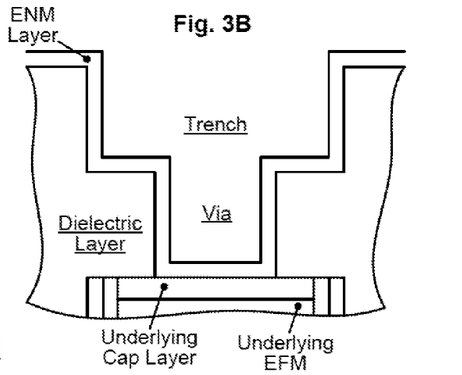
Figure 3C:
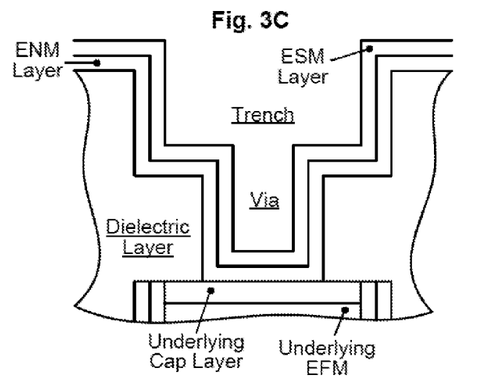
Figure 3D:
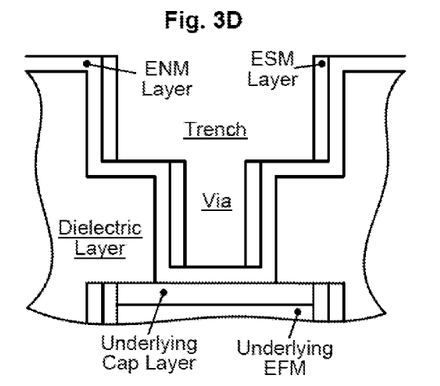

FIG. 3B illustrates deposition of an ENM layer on the dual damascene recess, in accordance with an embodiment of the present invention. The previous discussion with respect to the ENM layer of FIG. 1B and the various ENM deposition processes is equally applicable here. As best shown in FIGS. 3C and 3D, a layer of ESM is deposited or otherwise formed on the ENM layer, and then etched so that the ESM is removed from the via bottom and trench flats. The previous discussion with reference to provisioning and etching the ESM layer (such as with reference to FIGS. 1C-D and 2B-C) is equally applicable here.

Figure 3E:
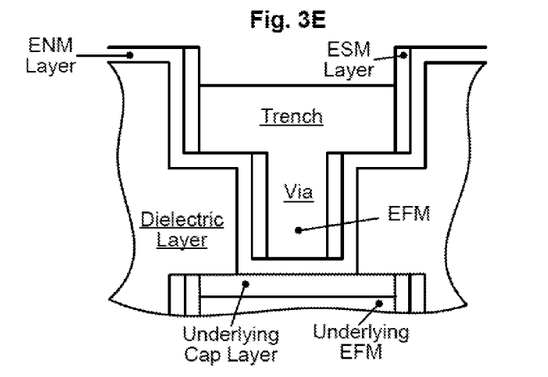

As shown in the example embodiment of FIG. 3E, EFM can then be deposited to fill the via portion and at least part of the trench portion of the dual damascene recess. The previous discussion with reference to provisioning the EFM (such as that discussion with reference to FIGS. 1F and 2E-E') is equally applicable here, but in this example embodiment, the electroless fill process is stopped before it completely finishes filling the trench.

Figure 3F:
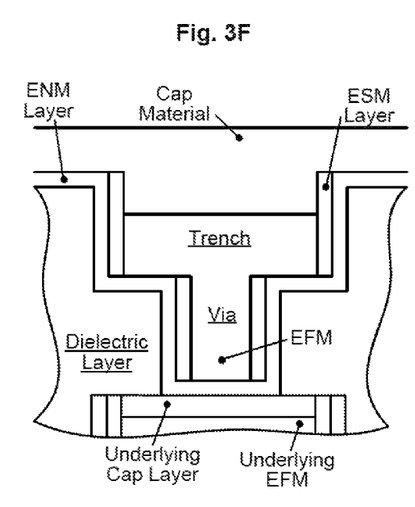
Figure 3G:
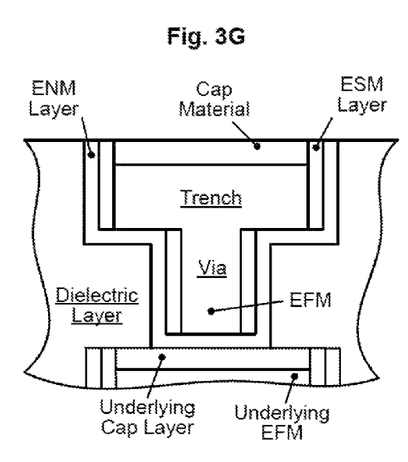

As shown in FIG. 3F, a layer of cap material can then be deposited on the EFM using, for example, PVD, CVD, ALD, electroplating, electroless deposition, or other suitable deposition technique. Such a capping layer can be used, for instance, to improve conductivity, process integration and/or to minimize the possibility of galvanic corrosion. In some example embodiments, the cap material can be, for instance, copper, cobalt, nickel, titanium, tantalum, ruthenium, palladium, silver, tungsten, alloys and combinations thereof, or any other suitable cap material that will provide the desired performance (e.g., conductivity, tune resistance, corrosion resistance, reliability, ease of polish, etc). Any cap material layer thickness can be used with various embodiments of the present invention and the thickness may vary widely. FIG. 3G illustrates the resulting integrated circuit structure after planarization, which can be implemented as previously explained, to remove excess cap material, etc.

To further reduce the risk of galvanic corrosion, a diffusion barrier layer may be disposed between the EFM and the cap material as best illustrated in FIG. 3F. In some such embodiments, the diffusion barrier can be, for example, tantalum, tantalum nitride, titanium, titanium nitride, ruthenium, cobalt, nickel, any alloy or combination thereof, or any other suitable material for forming a diffusion barrier capable of reducing a risk of galvanic corrosion. In one specific example case, where copper is used for the cap material and galvanic corrosion becomes a concern due to electroless metal/cap, an ultra-thin ALD (or CVD/PVD) diffusion barrier could be used, having a thickness of, for example, one-to-several monolayers. In a more general sense, the thickness of the capping material layer can be optimized to, for example, reduce process and consumables costs and defect performance, and improve reliability. The structure shown in FIG. 3G' is the planarized version of the structure shown in FIG. 3F.

ENM Reflow Process

FIGS. 4A-E'' illustrate formation of example conductive dual damascene interconnect structures in accordance with other embodiments of the present invention. In this example case, bottom-up fill of EFM for the conductive structure is enabled by an ENM layer formed on the bottom of the feature using a reflow process. Similar principles and techniques previously described herein equally apply, with certain distinctions specific to this embodiment noted in turn.

Figure 4A:
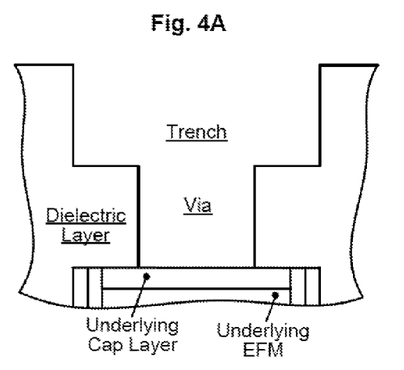
FIGS. 4A-E" illustrate formation of example conductive dual damascene interconnect structures in accordance with other embodiments of the present invention.

FIG. 4A shows formation of the etched dual damascene recess in the dielectric layer, which can be carried out as previously explained. As can be further seen, the etch lands on an underlying metal cap layer in this example embodiment, and as discussed with reference to FIG. 3A.

Figure 4B:
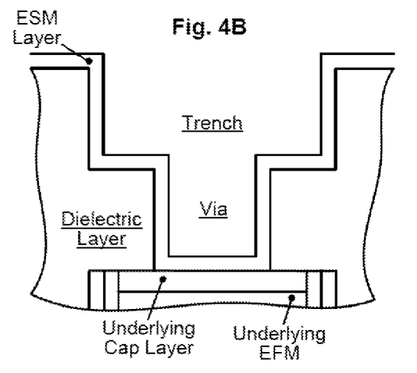

FIG. 4B illustrates conformal deposition of an ESM layer on the dual damascene recess, in accordance with an embodiment of the present invention. The previous discussion with reference to provisioning ESM layer (such as with reference to FIGS. 1C, 2B, and 3C) is equally applicable here. Note in this specific example case that the ESM layer is formed directly on the recess in the dielectric layer, and is not etched to expose any underlying ENM layer.

Figure 4C:
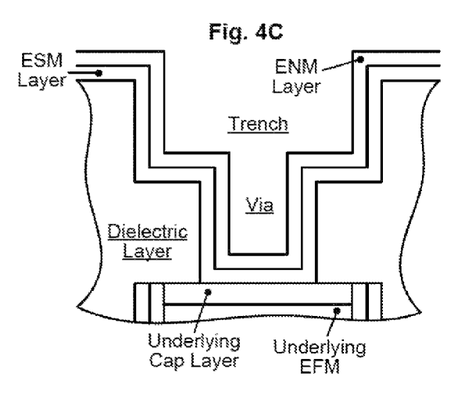

FIG. 4C illustrates deposition of an ENM layer on the ESM layer, in accordance with an embodiment of the present invention. The previous discussion with respect to provisioning the ENM layer (such as with reference to FIGS. 1B and 3B) is equally applicable here. In one specific such example case, a thin layer (e.g., one-to-several monolayers to 100 nm) of ENM having a low melting point (e.g., gold, nickel, copper, cobalt, aluminum, palladium, tin, or other suitably low melting point nucleation material) is provisioned through ALD, CVD or PVD deposition (other deposition techniques, such as electroless or electroplating can used if so desired, as will be appreciated). In some such cases, this deposition can be done with low bias to maximize the amount of material at the feature bottom and minimize the amount of material on the feature sidewall. As will be appreciated in light of this disclosure, the melting point of the ENM must be lower than the melting point of the ESM layer.

Figure 4D:
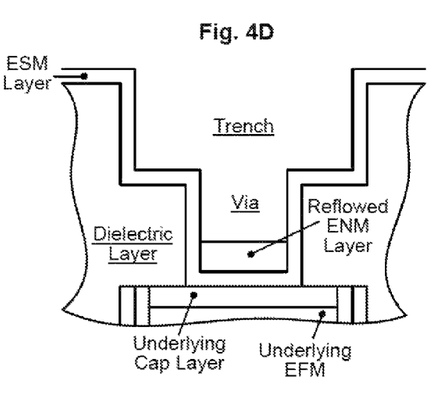

FIG. 4D illustrates the resulting structure after heating the structure to reflow the ENM, thereby causing any ENM on the feature sidewalls to move or otherwise flow to the feature bottom. In one such embodiment, the goal is to maximize the amount of ENM at the feature bottom and eliminate the ENM on the feature sidewalls, so as to expose the underlying ESM (which can be any provisioned barrier layer) on the feature sidewall. In one specific example case, the ENM layer is implemented with PVD copper ENM, but any number of materials and deposition systems can be used. The copper ENM layer reflow temperatures are in the range of about 75° C. to 450° C., in some such cases. As will be appreciated, other ENM layer materials may have different reflow temperature ranges. Note that the reflow can be done, for example, during the ENM layer deposition or after the ENM layer deposition. If residual ENM resides on the field post-reflow, and such residual ENM is undesired, note that subsequent processing can remove that residual material. For example, after reflow, the feature can be filled with a dielectric, for instance. Subsequent processing can then be used to remove the dielectric and residual ENM in the field, such as a CMP process. The dielectric could then be removed from the feature, during subsequent processing steps.

Figure 4E:
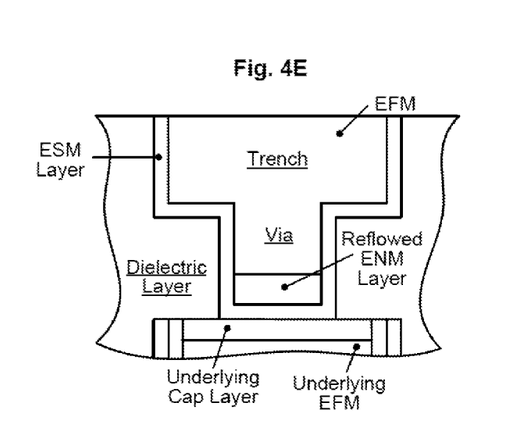

The rest of the fabrication process can proceed as previously described, with EFM deposition and planarization, as best shown in FIG. 4E. An alternative embodiment shown in FIG. 4E' uses a similar formation process, but is configured with a cap material layer (such as discussed with reference to FIGS. 3F-3G). Another alternative embodiment shown in FIG. 4E" uses a similar formation process, but is configured with a diffusion barrier between the cap material layer and the EFM (such as discussed with reference to FIGS. 3F-3G').

A number of observations will be apparent in light of this disclosure. For instance, and in accordance with some specific embodiments of the present invention, the cap material layer can be configured with a low aspect ratio to fill, thereby allowing for an all PVD cap deposition (no electroplating needed). In addition, the techniques provided are not limited to dual damascene structures. For instance, the techniques can also be used for high aspect ratio through-semiconductor vias as well.

Electroless Grow Rate Selectivity

Figure 5A:
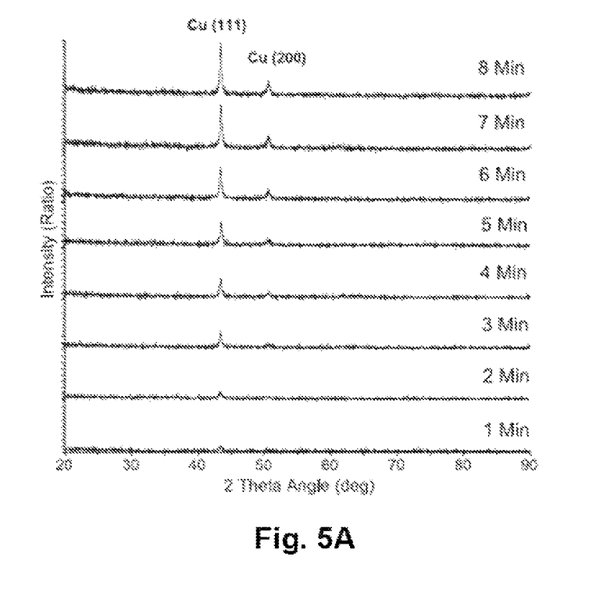
FIGS. 5A-B each illustrate an example method for forming an interconnect or other conductive structure in accordance with an embodiment of the present invention.
Figure 5B:
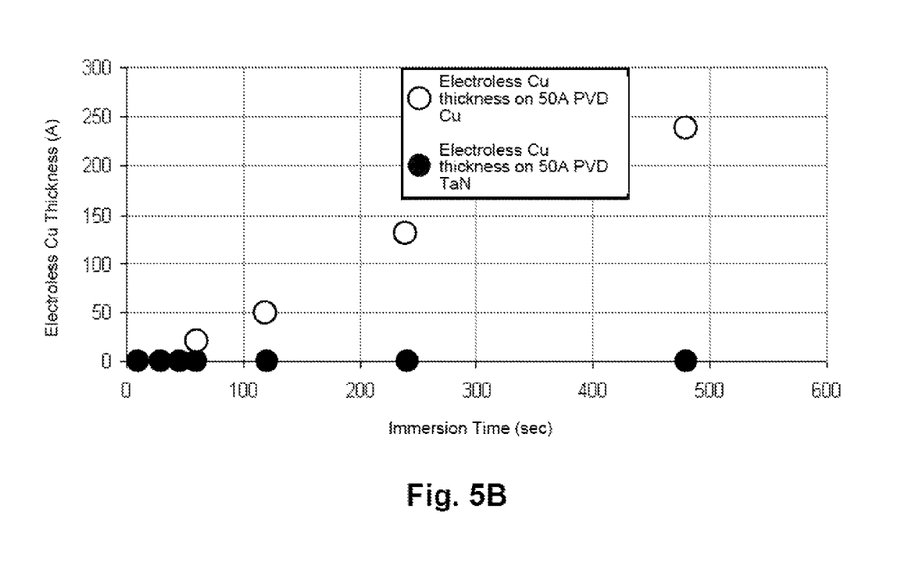

FIG. 5A x-ray diffraction (XRD) micrograph of electroless metal growth on an example substrate having a high electroless growth rate (ENM layer) compared to an example substrate having a low electroless growth rate electroless (ESM layer). In particular, the graph shows electroless copper (Cu) growth on 50 A PVD copper substrate and on a tantalum nitride (TaN) substrate. As can be seen, Cu (111) peak is observed even for 1 minute deposition, and becomes progressively greater as time goes on, showing a significant electroless copper growth rate on the copper substrate. In contrast, no or negligible Cu (200) peak was observed on the tantalum nitride substrate up to 8 minutes as shown (and continuing up to 20 minutes) of electroless copper deposition. FIG. 5B further illustrates the comparison of the electroless growth rates of the example EFM (Cu) on the example ENM (Cu) and ESM (TaN) layers. As can be seen, the electroless copper thickness as a function of deposition time on 50 A PVD Cu and TaN substrates is substantially different, as early in the electroless deposition as around 60 seconds, and reaches a difference of about 240 angstroms (A) after 480 seconds. This growth rate trend continues with further deposition time.

Example System

Figure 6:
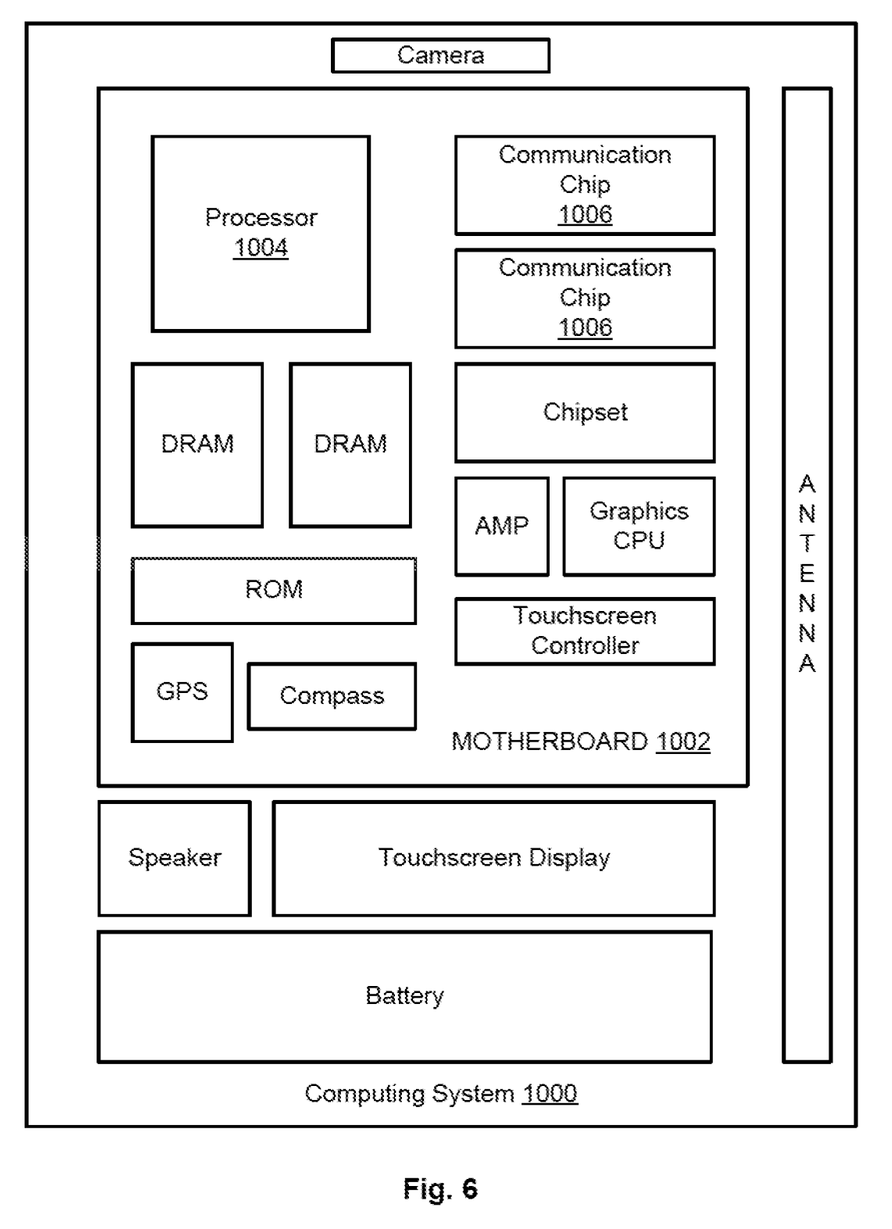
FIG. 6 illustrates an example computing system having one or more devices implemented with conductive structures formed in accordance with an embodiment of the present invention.

FIG. 6 illustrates a computing system 1000 implemented with one or more interconnect or other conductive structures configured in accordance with an example embodiment of the present invention. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of device 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more conductive structures as described herein (e.g., having a metal gate, conductive run, trench, via, dual damascene, and/or other structure or feature implemented with ENM and ESM having different electroless growth rates). These conductive structures can be used, for instance, to implement an on-board processor cache or memory array or a transistor circuit. In some embodiments, multiple functions can be integrated into one or more chips having one or more interconnect structures (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX, (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more conductive structures having a trench, via, dual damascene, and/or other structure, as variously described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more conductive structures as described herein (e.g., metal gates or conductive runs, trenches, dual damascene interconnects, etc). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the device 1000 may be any other electronic device that processes data or employs one or more integrated circuits having conductive structures as described herein.

Numerous embodiments will be apparent, and features described herein can be combined in any number of configurations. One example embodiment of the present invention provides a semiconductor device. The device comprises a dielectric layer configured with a recess having sidewalk and a bottom area. The device farther includes electroless nucleation material at the bottom area of the recess, and electroless suppression material on the sidewalk of the recess but not covering the bottom area of the recess. The device further includes an electroless fill metal disposed in the recess on the electroless nucleation material and the electroless suppression material in some cases, the device includes a metal cap over the electroless fill metal. In one such case, the device further includes a diffusion barrier between the metal cap and the electroless fill metal. In some cases, the electroless nucleation material is deposited into the recess. In one such case, the electroless nucleation material is reflowed to the trench bottom area after deposition. In some other cases, the electroless nucleation material is underneath the trench. In some cases, each of the electroless nucleation material (ENM) and electroless suppression material (ESM) has an electroless growth rate, and the ratio of ENM growth rate/ESM growth rate is greater than 1. In some cases, the electroless nucleation material comprises a pure metal or a doped alloy, and the electroless suppression material comprises a diffusion barrier material. In some cases, the electroless nucleation material comprises copper, and the electroless suppression material comprises tantalum. In some cases, the electroless fill metal comprises a plurality of electroless fill metals. Numerous other suitable materials will be apparent in light of this disclosure. In some cases, the trench is configured as at least one of an interconnect, trench, dual damascene feature, via, conductive run, and/or metal gate. Numerous variations and configurations will be apparent in light of this disclosure. For instance, another embodiment of the present invention provides an electronic system comprising to printed circuit board having one or more semiconductor devices as defined in any of the preceding claims. In some cases, the one or more semiconductor devices comprise at least one of a communication chip and/or a processor. In some cases, the system is a computing system.

Another embodiment of the present invention provides a semiconductor device. The device includes a dielectric layer configured with a plurality of recesses each having sidewalls and a bottom area. The device further includes electroless nucleation material at the bottom area of each recess, and electroless suppression material on the sidewalls of each recess but not covering the bottom area of each recess. The device further includes electroless fill metal disposed in each recess on the electroless nucleation material and the electroless suppression material. Each of the electroless nucleation material (ENM) and electroless suppression material (ESM) has an electroless growth rate, and the ratio of ENM growth rate/ESM growth rate is greater than 1. In some cases, the device further includes a metal cap over the electroless fill metal of each recess. In some such cases, the device may further include a diffusion barrier between each metal cap and the electroless fill metal. In some cases, the electroless nucleation material is underneath at least one of the recesses (as opposed to being formed in the recess).

Another embodiment of the present invention provides a method for forming a semiconductor device. The method includes providing a dielectric layer configured with a recess having sidewalls and a bottom area. The method further includes providing electroless nucleation material at the bottom area of the recess, and providing electroless suppression material on the sidewalls of the recess but not covering the bottom area of the recess. The method further includes providing, by electroless deposition, electroless fill metal disposed in the recess on the electroless nucleation material and the electroless suppression material. In some cases, the method further includes providing a metal cap over the electroless fill metal. In some such cases, the method further includes providing a diffusion barrier between the metal cap and the electroless fill metal. In some cases, providing the electroless nucleation material at the bottom area of the recess is a deposition process. In one such case, providing the electroless nucleation material at the bottom area of the recess the electroless nucleation material comprises reflowing the electroless nucleation material to the recess bottom area after deposition. In some cases, providing the electroless nucleation material at the bottom area of the recess includes etching the recess to expose electroless nucleation material underneath the recess (such as when the recess itself it being etched). In some cases, each of the electroless nucleation material (ENM) and electroless suppression material (ESM) has an electroless growth rate, and the ratio of ENM growth rate/ESM growth rate is greater than 1. In some cases, the electroless nucleation material comprises a pure metal or a doped alloy, and the electroless suppression material comprises a diffusion barrier material.

The foregoing description of example embodiments of the invention has been presented for the purposes of illustration and description. It is not intended to be exhaustive or to limit the invention to the precise terms disclosed. Many modifications and variations are possible in light of this disclosure. For instance, while an electroless deposition process is used to provide the EFM, other layers including the ESM, ENM, diffusion barrier, and/or cap layers may be provided by any suitable deposition technique (e.g., PVD, CVD, ALD, electroplating, electroless deposition, or other suitable deposition technique). In this sense, the terms 'electroless nucleation material' (or 'ENM') and 'electroless suppression material' (or 'ESM') are not intended to be limited electroless deposition techniques. It is intended that the scope of the invention be limited not by this detailed description, but rather by the claims appended hereto.

What is claimed is:

1. A semiconductor device, comprising:
    a dielectric layer configured with a recess having sidewalls and a bottom area;
    an electroless suppression material layer adjacent the sidewalls of the recess but not covering the bottom area of the recess, wherein the electroless suppression material layer adjacent the sidewalls comprises an outer and inner surface, the inner surface being further from the sidewalls than the outer surface;
    an electroless nucleation material layer adjacent the bottom area of the recess and also between the sidewalls and the outer surface of the electroless suppression material layer, wherein no electroless nucleation material is on the inner surface of the electroless suppression material layer adjacent the sidewalls;
    electroless fill metal disposed in the recess on the electroless nucleation material and in direct contact with the inner surface of the electroless suppression material layer; and a metal cap over the electroless fill metal.

2. The device of claim 1 further comprising:
    a diffusion barrier between the metal cap and the electroless fill metal.

3. The device of claim 1 wherein the electroless nucleation material layer is deposited into the recess.

4. The device of claim 1 wherein the electroless nucleation material layer is underneath the recess.

5. The device of claim 1 wherein each of the electroless nucleation material (ENM) layer and electroless suppression material (ESM) layer has an electroless growth rate, and the ratio of ENM growth rate/ESM growth rate is greater than 1.

6. The device of claim 1 wherein the electroless nucleation material layer comprises a pure metal or a doped alloy, and the electroless suppression material layer comprises a diffusion barrier material.

7. The device of claim 1 wherein the electroless nucleation material layer comprises copper, and the electroless suppression material layer comprises tantalum.

8. The device of claim 1 wherein the electroless fill metal disposed in the recess is configured as at least one of an interconnect, trench, dual damascene feature, via, conductive run, and/or metal gate.

9. The device of claim 1 wherein the electroless fill metal comprises a plurality of electroless fill metals.

10. An electronic system comprising:
a printed circuit board having one or more semiconductor devices as defined in claim 1.

11. The electronic system of claim 10 wherein the one or more semiconductor devices comprise at least one of a communication chip and/or a processor.

12. The electronic system of claim 10 wherein the system is a computing system.

13. A method for forming a semiconductor device, comprising:
providing a dielectric layer configured with a recess having sidewalls and a bottom area;
providing, by a deposition process, electroless nucleation material at the bottom area of the recess, wherein providing the electroless nucleation material at the bottom area of the recess further comprises reflowing the electroless nucleation material to the recess bottom area after deposition;
providing electroless suppression material on the sidewalls of the recess but not covering the bottom area of the recess; and
providing, by electroless deposition, electroless fill metal disposed in the recess on the electroless nucleation material and the electroless suppression material.

14. The method of claim 13 further comprising:
providing a metal cap over the electroless fill metal.

15. The method of claim 14 further comprising:
providing a diffusion barrier between the metal cap and the electroless fill metal.

16. The method of claim 13 wherein providing the electroless nucleation material at the bottom area of the recess comprises etching the recess to expose electroless nucleation material underneath the recess.

17. The method of claim 13 wherein each of the electroless nucleation material (ENM) and electroless suppression material (ESM) has an electroless growth rate, and the ratio of ENM growth rate/ESM growth rate is greater than 1.

18. The method of claim 13 wherein the electroless nucleation material comprises a pure metal or a doped alloy, and the electroless suppression material comprises a diffusion barrier material.

* * * * *